(12) United States Patent
Kim et al.

(10) Patent No.: US 12,193,299 B2
(45) Date of Patent: Jan. 7, 2025

(54) DISPLAY DEVICE INCLUDING A PARTITION WALL HAVING EMISSION LAYERS DISPOSED IN OPENINGS THEREOF

(71) Applicant: SAMSUNG DISPLAY CO., LTD., Yongin-si (KR)

(72) Inventors: Hyang Yul Kim, Hwaseong-si (KR); Hee Seong Jeong, Suwon-si (KR); Hyun-Gue Song, Hwaseong-si (KR); Jong Beom Hong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 292 days.

(21) Appl. No.: 17/651,151

(22) Filed: Feb. 15, 2022

(65) Prior Publication Data

US 2022/0407039 A1   Dec. 22, 2022

(51) Int. Cl.
*H10K 59/35* (2023.01)
*H10K 50/86* (2023.01)
(Continued)

(52) U.S. Cl.
CPC ........... *H10K 59/35* (2023.02); *H10K 50/865* (2023.02); *H10K 59/38* (2023.02);
(Continued)

(58) Field of Classification Search
CPC .... H10K 50/125; H10K 50/80; H10K 50/813; H10K 50/844; H10K 50/86; H10K 50/865; H10K 50/88; H10K 59/00; H10K 59/122; H10K 59/123; H10K 59/126; H10K 59/30; H10K 59/35; H10K 59/352; H10K 59/353; H10K 59/38; H10K 59/873; H10K 59/8792
See application file for complete search history.

(56) References Cited

U.S. PATENT DOCUMENTS

| 2015/0249120 A1 | 9/2015 | Cheng et al. |
| 2016/0133673 A1 | 5/2016 | Kim |

(Continued)

FOREIGN PATENT DOCUMENTS

| JP | 2015144087 | 8/2015 |
| KR | 20130143308 | 12/2013 |

(Continued)

*Primary Examiner* — Cheung Lee
(74) *Attorney, Agent, or Firm* — F.CHAU & ASSOCIATES, LLC

(57) ABSTRACT

A display device includes a substrate, a partition wall disposed on the substrate and having a plurality of openings, a first emission layer, a second emission layer, and a third emission layer respectively disposed in an opening of the partition wall and emitting light of different colors, a light blocker disposed on the emission layers and including a plurality of openings respectively overlapping the first emission layer, the second emission layer, and the third emission layer, and a color filter disposed in the opening of the light blocker. A separation distance between one edge of the partition wall contacting the second emission layer and the light blocker is greater than a separation distance between the one edge of the partition wall contacting the first emission layer and the light blocker.

26 Claims, 18 Drawing Sheets

(51) Int. Cl.
  *H10K 59/38* (2023.01)
  *H10K 59/80* (2023.01)
  *H10K 59/122* (2023.01)
(52) U.S. Cl.
  CPC ....... *H10K 59/8792* (2023.02); *H10K 59/122* (2023.02); *H10K 59/353* (2023.02)

(56) References Cited

U.S. PATENT DOCUMENTS

2017/0033164 A1 2/2017 Liu
2018/0158882 A1 6/2018 Kim et al.
2021/0066670 A1* 3/2021 Matsuoka .............. H10K 59/38

FOREIGN PATENT DOCUMENTS

KR    20140039676    4/2014
KR    20180073194    7/2018
KR      101913455   10/2018

* cited by examiner

DISPLAY DEVICE INCLUDING A PARTITION WALL HAVING EMISSION LAYERS DISPOSED IN OPENINGS THEREOF

CROSS-REFERENCE TO RELATED APPLICATION

This application claims priority to and the benefit of Korean Patent Application No. 10-2021-0080018, filed in the Korean Intellectual Property Office on Jun. 21, 2021, the entire contents of which are incorporated by reference herein.

TECHNICAL FIELD

The present disclosure relates to a display device, and more particularly, to a display device including a partition wall having emission layers disposed in openings thereof.

DISCUSSION OF THE RELATED ART

A light emitting display such as an organic light-emitting diode (OLED) display device is a self-emissive display device using a phenomenon in which electrons and holes injected to an emission layer through an anode and a cathode are recombined to generate excitons, and light with a specific wavelength is generated by energy from the excitons. Therefore, the light emitting display requires no additional light source such as a backlight. Light emitting displays may additionally have relatively low power consumption, a wide viewing angle, and a fast response speed.

An image may be displayed by a matrix of pixels arranged in a display area thereof. The matrix of pixels may include red, green, and blue pixels with different types of emission layers being disposed between a first electrode that is an anode and a second electrode that is a cathode so as to emit red (R), green (G), and blue (B) light within respective pixels. In the case of an active matrix type of light emitting display, the respective pixels contact the light-emitting elements to form thin film transistors and the pixels are independently controlled.

Such display devices may make use of color filters disposed on an upper portion of a thin-film encapsulation structure of the light emitting display to controlling reflection of external light without the use of a polarizer and to increase optical efficiency of the emission layers.

SUMMARY

An embodiment of the present invention provides a display device including a substrate, a partition wall disposed on the substrate and having a plurality of openings, a first emission layer, a second emission layer, and a third emission layer respectively disposed in an opening of the partition wall and emitting light of different colors, a light blocking member (e.g., a light blocker) disposed on the emission layer and including a plurality of openings respectively overlapping the first emission layer, the second emission layer, and the third emission layer, and a color filter disposed in the opening of the light blocking member. A separation distance between one edge of the partition wall contacting the second emission layer and the light blocking member is greater than a separation distance between the one edge of the partition wall contacting the first emission layer and the light blocking member.

A separation distance between the one edge of the partition wall contacting the first emission layer and the light blocking member may be greater than a separation distance between the one edge of the partition wall contacting the third emission layer and the light blocking member.

The first emission layer may emit red light, the second emission layer may emit green light, and the third emission layer may emit blue light.

A separation distance between the one edge of the partition wall contacting the first emission layer and the light blocking member may be within a range from 3.5 μm to 5.5 μm.

A difference between a separation distance the one edge of the partition wall contacting the second emission layer and the light blocking member and a separation distance between the one edge of the partition wall contacting the first emission layer and the light blocking member may be equal to or less than 5 μm.

A difference between a separation distance between one edge of a partition wall contacting the first emission layer and the light blocking member and a separation distance between one edge of a partition wall contacting the third emission layer and the light blocking member may be equal to or less than 5 μm.

A separation distance between the one edge of the partition wall contacting the second emission layer and the light blocking member may be greater than a separation distance between the one edge of the partition wall contacting the first emission layer and the light blocking member by 1 μm, and a separation distance between the one edge of the partition wall contacting the first emission layer and the light blocking member may be greater than a separation distance between the one edge of the partition wall contacting the third emission layer and the light blocking member by 1 μm.

The color filter may include a first color filter overlapping the first emission layer in a direction that is perpendicular to a side of the substrate, a second color filter overlapping the second emission layer in the direction that is perpendicular to the side of the substrate, and a third color filter overlapping the third emission layer in the direction that is perpendicular to the side of the substrate, and the first color filter, the second color filter, and the third color filter may have different colors.

A separation distance between the one edge of the partition wall contacting the second emission layer and the light blocking member and a separation distance between the one edge of the partition wall contacting the first emission layer and the light blocking member may be within 25% of one another.

A separation distance between the one edge of the partition wall contacting the first emission layer and the light blocking member and a separation distance between the one edge of the partition wall contacting the third emission layer and the light blocking member may be within 25% of one another.

A width of a light blocking member disposed between the first color filter and the second color filter may be less than a width of a light blocking member disposed between the second color filter and the third color filter.

A width of a light blocking member disposed between the second color filter and the third color filter may be less than a width of a light blocking member disposed between the third color filter and the first color filter.

The first color filter may be a red color filter, the second color filter may be a green color filter, and the third color filter may be a blue color filter.

The display device may further include a plurality of transistors disposed on the substrate, a plurality of first electrodes respectively connected to the transistors, and a second electrode disposed on the first emission layer, the second emission layer, the third emission layer, and the partition wall.

The partition wall may include a black material.

The display device might not include a polarization layer.

A width of a light blocking member disposed between the first color filter and the second color filter, a width of a light blocking member disposed between the second color filter and the third color filter, and a width of a light blocking member disposed between the third color filter and the first color filter may all be the same.

An embodiment of the present invention provides a display device including a substrate, a partition wall disposed the substrate and having a plurality of openings, a first emission layer, a second emission layer and a third emission layer respectively disposed in the openings of the partition wall and emitting light of different colors, a light blocking member disposed on the emission layer and having a plurality of openings respectively overlapping the first emission layer, the second emission layer, and the third emission layer, and a color filter disposed in the opening of the light blocking member. The color filter includes a first color filter overlapping the first emission layer in a direction that is perpendicular to a side of the substrate, a second color filter overlapping the second emission layer in the direction that is perpendicular to the side of the substrate, and a third color filter overlapping the third emission layer in the direction that is perpendicular to the side of the substrate. A width of a light blocking member disposed between the second color filter and the third color filter is less than a width of a light blocking member disposed between the third color filter and the first color filter.

A width of a light blocking member disposed between the first color filter and the second color filter may be less than a width of a light blocking member disposed between the second color filter and the third color filter.

A separation distance between one edge of the partition wall contacting the first emission layer and the light blocking member, a separation distance between one edge of the partition wall contacting the second emission layer and the light blocking member, and a separation distance between one edge of the partition wall contacting the third emission layer and the light blocking member may all be the same.

An embodiment of the present invention provides a display device including a substrate, a partition wall disposed on the substrate and having a plurality of openings, a red emission layer, a green emission layer, and a blue emission layer respectively disposed in the openings of the partition wall, and a light blocking member disposed on the emission layer and having a plurality of openings respectively overlapping a red emission layer, a green emission layer, and a blue emission layer. A separation distance between one edge of the partition wall contacting the red emission layer and the light blocking member is greater than a separation distance between one edge of the partition wall contacting the blue emission layer and the light blocking member.

The display device may further include a color filter disposed in the opening of the light blocking member. The color filter may include a red color filter overlapping the red emission layer in a direction that is perpendicular to a side of the substrate, a green color filter overlapping the green emission layer in the direction that is perpendicular to the side of the substrate, and a blue color filter overlapping the blue emission layer in the direction that is perpendicular to the side of the substrate. A width of a light blocking member disposed between the green color filter and the blue color filter may be greater than a width of a light blocking member disposed between the red color filter and the green color filter.

The partition wall may include a black material, and the display device might not include a polarization layer.

A separation distance between one edge of the partition wall contacting the red emission layer and the light blocking member may correspond to a distance between one edge of the partition wall contacting the green emission layer and the light blocking member.

A separation distance between one edge of the partition wall contacting the green emission layer and the light blocking member may be greater than a separation distance between one edge of the partition wall contacting the red emission layer and the light blocking member.

The display device may further include a plurality of transistors disposed on the substrate, a plurality of first electrodes respectively connected to the transistors, a second electrode disposed on the red emission layer, the green emission layer, the blue emission layer, and the partition wall, and an encapsulation layer disposed on the second electrode.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIG. 11 shows a red emission layer, FIG. 12 shows a green emission layer, and FIG. 13 shows a blue emission layer;

DETAILED DESCRIPTION OF THE EMBODIMENTS

Figure 1:
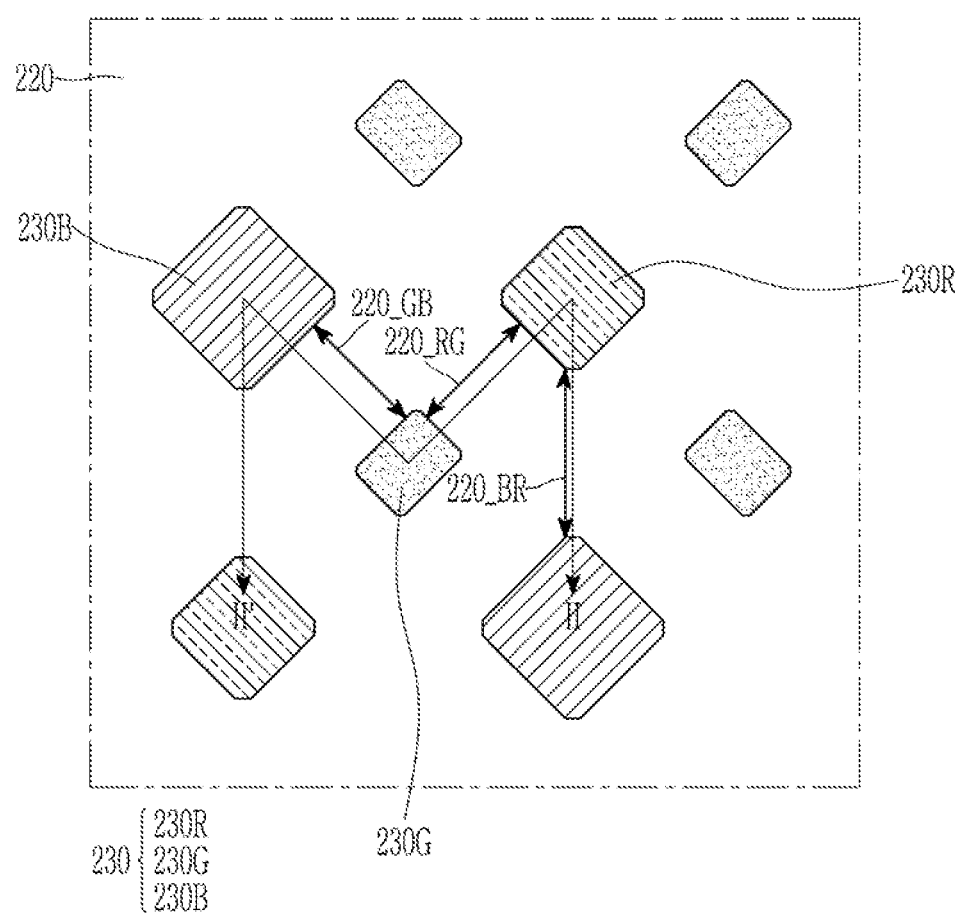
FIG. 1 shows a display device according to an embodiment of the present disclosure.

The present invention will be described more fully hereinafter with reference to the accompanying drawings, in which example embodiments of the invention are shown. As those skilled in the art would realize, the described embodiments may be modified in various different ways, all without departing from the spirit or scope of the present invention.

In the instant specification and the drawings, like elements may be designated by the same reference numerals.

The size, thickness, and angles of each configuration shown in the drawings may be exaggerated for clarity, however, it is to be assumed that the arrangement shown may be taken as a specific example.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" may mean positioned either above or below the object portion, and does not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of any other elements.

The phrase "in a plan view" means viewing an object portion from the top, and the phrase "in a cross-sectional view" means viewing a cross-section of which the object portion is vertically cut from the side.

A display device according to an embodiment of the present invention will now be described in detail with reference to accompanying drawings.

Figure 2:
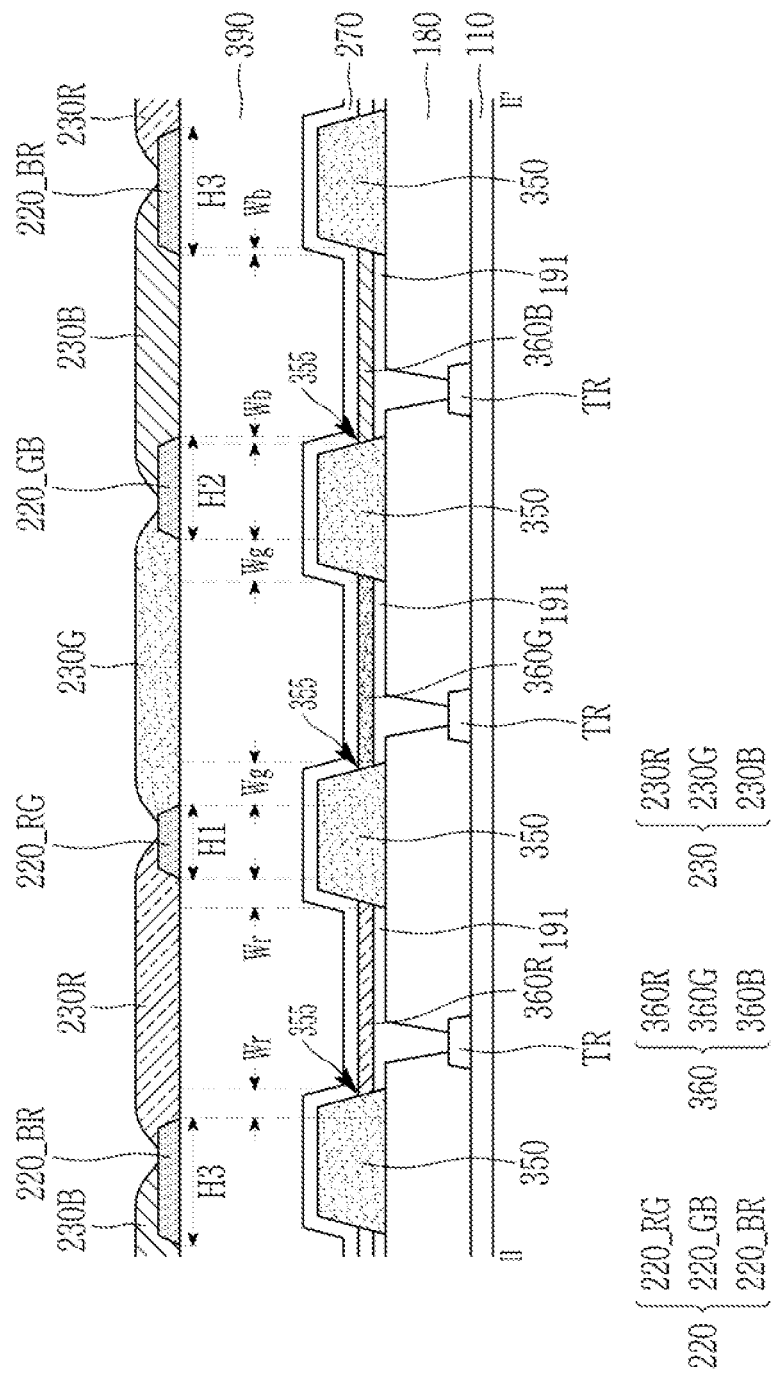
FIG. 2 shows a cross-sectional view of a display device according to an embodiment of the present disclosure along line II-II' of FIG. 1.

FIG. 1 shows a display device according to an embodiment of the present disclosure. FIG. 1 shows a ground plan view of a display device, illustrating a color filter 230 and a light blocking member 220 positioned on an upper side of the display device. FIG. 2 shows a cross-sectional view of a display device according to an embodiment of the present disclosure with respect to a line II-II' of FIG. 1. FIG. 2 shows a central part of a display device in accordance with embodiments of the present disclosure. Referring to FIG. 2, the display device includes a substrate 110, a plurality of transistors (TR) positioned on the substrate, a first electrode 191 connected to the respective transistors (TR), and an insulating layer 180 positioned between the transistor (TR) and the first electrode 191.

A plurality of partition walls 350 are positioned on the insulating layer 180, and the partition walls 350 may include a plurality of openings 355 overlapping the first electrode 191.

The partition walls 350 may include a black material. For example, the partition walls 350 may include a light blocking material, and the partition walls 350 may block the light at a lower portion of the partition walls 350.

Respective emission layers 360 are positioned in the openings 355. The emission layers 360 may include a first emission layer 360R, a second emission layer 360G, and a third emission layer 360B. The first emission layer 360R may be a red emission layer, the second emission layer 360G may be a green emission layer, and the third emission layer 360B may be a blue emission layer.

A second electrode 270 is positioned on the emission layers 360 and the partition wall 350. The respective emission layers 360 may emit light according to voltages supplied from the first electrode 191 and the second electrode 270. The first electrode 191, the second electrode 270, and the emission layer 360 may configure a light emitting element.

Referring to FIG. 2, an encapsulation layer 390 is positioned on the second electrode 270. The encapsulation layer 390 may have a multi-layered structure in which inorganic layers and organic layers are alternately stacked.

A light blocking member 220 is positioned on the encapsulation layer 390. The light blocking member 220 may overlap the partition wall 350 in a direction that is perpendicular to a side of the substrate 110. As shown in FIG. 1, the light blocking member 220 may include a plurality of openings overlapping the emission layers 360, and the color filters 230 may be positioned in the openings. The color filters 230 may include a first color filter 230R, a second color filter 230G, and a third color filter 230B. The first color filter 230R may be a red color filter, the second color filter 230R may be a green color filter, and the third color filter 230B may be a blue color filter.

The light blocking member 220 may be divided into a first light blocking member 220_RG, a second light blocking member 220_GB, and a third light blocking member 220_BR according to adjacent color filters. The first light blocking member 220_RG indicates a portion positioned between the first color filter 230R and the second color filter 230G. The second light blocking member 220_GB indicates a portion positioned between the second color filter 230G and the third color filter 230B. The third light blocking member 220_BR indicates a portion positioned between the third color filter 230B and the first color filter 230R.

In the cross-sectional diagram of FIG. 2, for better comprehension and ease of description, the light blocking member 220 is referred to as the first light blocking member 220_RG, the second light blocking member 220_GB, and the third light blocking member 220_BR, but as shown in FIG. 1, the first light blocking member 220_RG, the second light blocking member 220_GB, and the third light blocking member 220_BR may be connected as a single body. For example, the first light blocking member 220_RG, the second light blocking member 220_GB, and the third light blocking member 220_BR may refer to a predetermined region of the light blocking member 220 connected as one singular and uninterrupted body.

Referring to FIG. 2, widths of the first light blocking member 220_RG to the third light blocking member 220_BR are different from each other. When the width of the first light blocking member 220_RG is set to be H1, the width of the second light blocking member 220_GB is set to be H2, and the width of the third light blocking member 220_BR is set to be H3, such that a relationship of H3≥H2≥H1 may be satisfied. For example, regarding the display device according to the present embodiment, the width (H3) of the third light blocking member 220_BR may be the largest, and the width (H1) of the first light blocking member 220_RG may be the smallest. This arrangement may provide color characteristics that do not change noticeably according to the viewing angle and do not require the inclusion of a polarization layer. Detailed effects will be described in a later portion of the present specification.

A difference between the width (H3) of the third light blocking member 220_BR and the width (H1) of the second light blocking member 220_GB may be within a range of 1 μm to 10 μm. A difference between the width (H2) of the second light blocking member 220_GB and the width (H1) of the first light blocking member 220_RG may be within a range of 1 μm to 10 μm.

Referring to FIG. 2, the respective emission layers 360 are positioned in the openings 355 of the partition wall 350. The partition wall 350 is positioned on respective sides of the emission layer 360, and the distances (W) between one edge of the partition wall 350 contacting the emission layer 360 and the light blocking member 220 overlapping the partition wall 350 are different for the respective pixels.

For example, as shown in FIG. 2, the first emission layer 360R is positioned to contact the third light blocking member 220_BR and the first light blocking member 220_RG. A separation distance between the one edge of the partition wall 350 contacting the first emission layer 360R and the third light blocking member 220_BR and a separation distance between the one edge of the partition wall 350 contacting the first emission layer 360R and the first light blocking member 220_RG may be the same, which will be referred to as Wr.

The second emission layer 360G is positioned to contact the first light blocking member 220_RG and the second light blocking member 220_GB. A separation distance between the one edge of the partition wall 350 contacting the second emission layer 360G and the first light blocking member 220_RG and a separation distance between the one edge of the partition wall 350 contacting the second emission layer 360G and the second light blocking member 220_GB may be the same, which will be referred to as Wg.

The third emission layer 360B is positioned near the second light blocking member 220_GB and the third light blocking member 220_BR. A separation distance between the one edge of the partition wall 350 contacting the third emission layer 360B and the second light blocking member 220_GB and a separation distance between the one edge of the partition wall 350 contacting the third emission layer 360B and the third light blocking member 220_BR may be the same, which will be referred to as Wb.

Referring to FIG. 2, separation distances between the one edge of the partition wall 350 contacting the respective emission layers and the light blocking member may satisfy the relationship of Wg≥Wr≥Wb. For example, the distance (Wg) between the one edge of the partition wall 350 contacting the second emission layer 360G and the light blocking member may be the longest, and the distance (Wb) between the one edge of the partition wall 350 contacting the third emission layer 360B and the light blocking member may be the shortest.

Referring to FIG. 2, the distance (Wr) between the partition wall 350 contacting the first emission layer 360R and the light blocking member may be within a range of 3.5 μm to 5.5 μm. For example, the distance (Wr) between the one edge of the partition wall 350 contacting the first emission layer 360R and the light blocking member may be 4.5 μm. This numerical value represents the separation distance for efficiently transmitting the light emitted by the first emission layer 360R in all directions. For example, the first emission layer 360R is separated from the light blocking member, so the light output to the side as well as to the front from the first emission layer 360R may be discharged to the outside of the display device.

In the present embodiment, the difference between Wr and Wg may be equal to or less than 5 μm. In an embodiment, Wg may be greater than Wr by 1 μm. In the present embodiment, the difference between Wr and Wb may be equal to or less than 5 μm. In an embodiment, Wr may be greater than Wb by 1 μm.

When the difference between Wr and Wg is equal to or greater than 5 μm or the difference between Wr and Wb is equal to or greater than 5 μm, a region of the emission layer may be excessively narrow, or the size of the partition wall may be excessively reduced, which may be undesirable.

When the distance between the emission layer and the neighboring light blocking member is set to be different for the respective pixels, the display device including no polarization layer may maintain the lateral color coordinate in a similar way to the display device including a polarization layer.

For example, the display device according to the present embodiment does not include the polarization layer. Instead of this, the partition wall 350 includes a black material to block light and overlaps the emission layer 360, and the color filter 230 is positioned to replace a function of the polarization layer. The display device including no polarization layer, as described above, may have a color difference of the lateral side from the display device including a polarization layer. The display device including a polarization layer has a greenish color sense by an optical path that is difference when seen from the lateral side, and the display device including no polarization layer may have a bluish color.

The display device may satisfy the relationship of "the distance (Wg) between the one edge of the partition wall contacting the second emission layer (green) and the light blocking member≥the distance (Wr) between the one edge of the partition wall contacting the first emission layer (red) and the light blocking member≥the distance (Wb) between the one edge of the partition wall contacting the third emission layer (blue) and the light blocking member."

The width of the light blocking member may satisfy the relationship of "the width (H3) of the third light blocking member≥the width (H2) of the second light blocking member≥the width (H1) of the first light blocking member."

By this, the display device including no polarization layer may have a similar color sense visible from the lateral side to the display device including a polarization layer.

The present invention may satisfy at least one of the relationship of the width of the light blocking member (the width (H3) of the third light blocking member≥the width (H2) of the second light blocking member the width (H1) of the first light blocking member), and the distance relationship with the light blocking member (the distance (Wg) between the one edge of the partition wall contacting the second emission layer (green) and the light blocking member the distance (Wr) between the one edge of the partition wall contacting the first emission layer (red) and the light blocking member≥the distance (Wb) between the one edge of the partition wall of the third emission layer (blue) and the light blocking member).

For example, when one of the two relationships is satisfied, effects of the present disclosure may be exhibited.

FIG. 2 shows the case that satisfies the two relationships, and the case that satisfies one of the two relationships is also included within the present invention.

Figure 3:
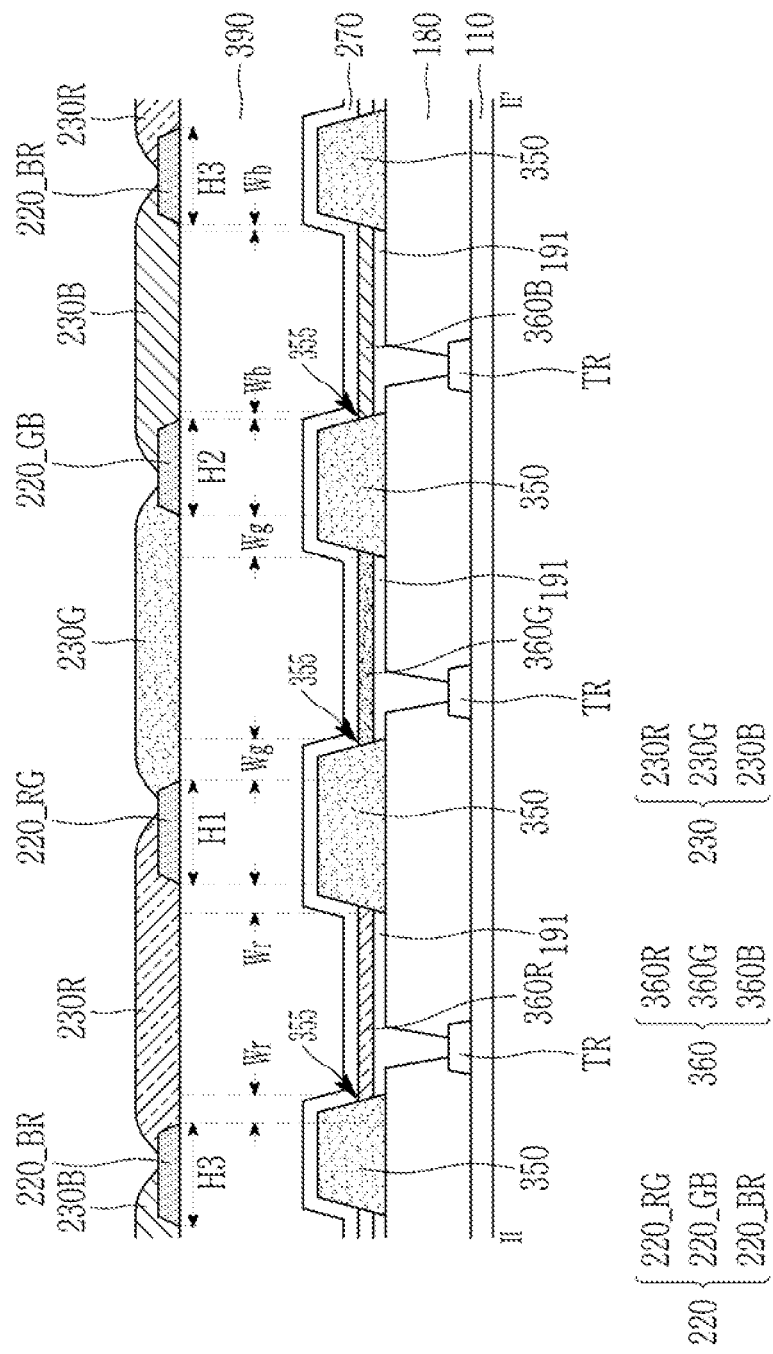
FIG. 3 shows a same cross-sectional view as FIG. 2 on a display device according to an embodiment of the present disclosure.

FIG. 3 shows a same cross-sectional view as FIG. 2 on a display device according to an embodiment of the present disclosure.

Referring to FIG. 3, the display device has the relationship of "the distance (Wg) between the one edge of the partition wall contacting the second emission layer (green) and the light blocking member≥the distance (Wr) between the one edge of the partition wall contacting the first emission layer (red) and the light blocking member≥the distance (Wb) between the one edge of the partition wall contacting the third emission layer (blue) and the light blocking member," but has the relationship of "the width (H3) of the third light blocking member=the width (H2) of the second light blocking member=the width (H1) of the first light blocking member," which is different from what is described with reference to FIG. 2. To the extent that a detailed description of a particular element has been omitted, it may be assumed that the element is at least similar to corresponding elements that have been disclosed elsewhere within the instant specification.

As shown in FIG. 3, it is given that H3=H2=H1, and the case of Wg>Wr>Wb may also have similar effects to what is described with reference to FIG. 2.

Figure 4:
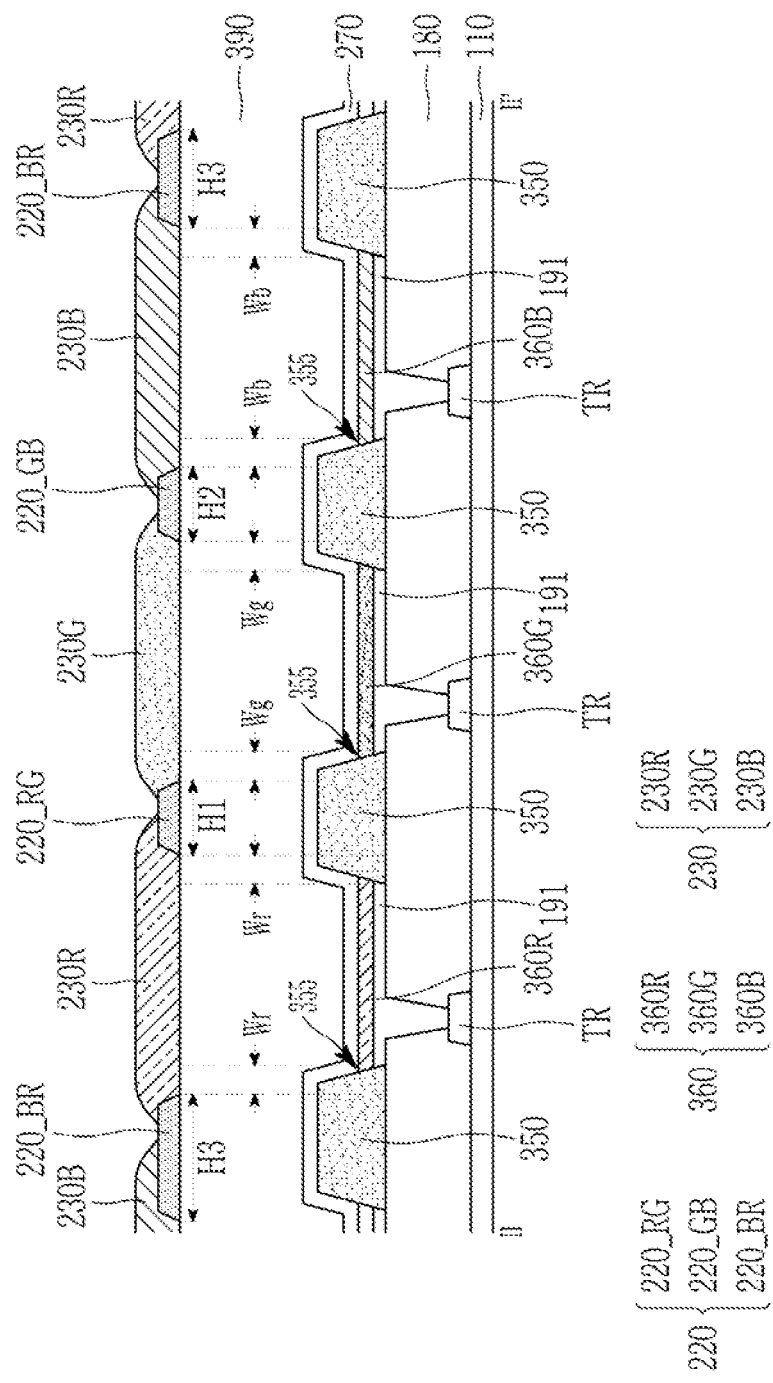
FIG. 4 shows a same cross-sectional view as FIG. 2 on a display device according to an embodiment of the present disclosure.

FIG. 4 shows a same cross-sectional view as FIG. 2 on a display device according to an embodiment of the present disclosure. Referring to FIG. 4, the display device satisfies the relationship of "the width (H3) of the third light blocking member≥the width (H2) of the second light blocking member the width (H1) of the first light blocking member", but also satisfies the relationship of "the distance (Wg) between the one edge of the partition wall contacting the second emission layer (green) and the light blocking member=the distance (Wr) between the one edge of the partition wall contacting the first emission layer (red) and the light blocking member=the distance (Wb) between the one edge of the partition wall contacting the third emission layer (blue) and the light blocking member," which is different from what is described with reference to FIG. 2. To the extent that a detailed description of a particular element has been omitted, it may be assumed that the element is at least similar to corresponding elements that have been disclosed elsewhere within the instant specification.

As shown in FIG. 4, it is given that H3>H2>H1, and the case of Wg=Wr=Wb may also have similar effects to what is described with reference to FIG. 2.

Effects of the display device according to the present embodiment will now be described in detail.

Figure 5:
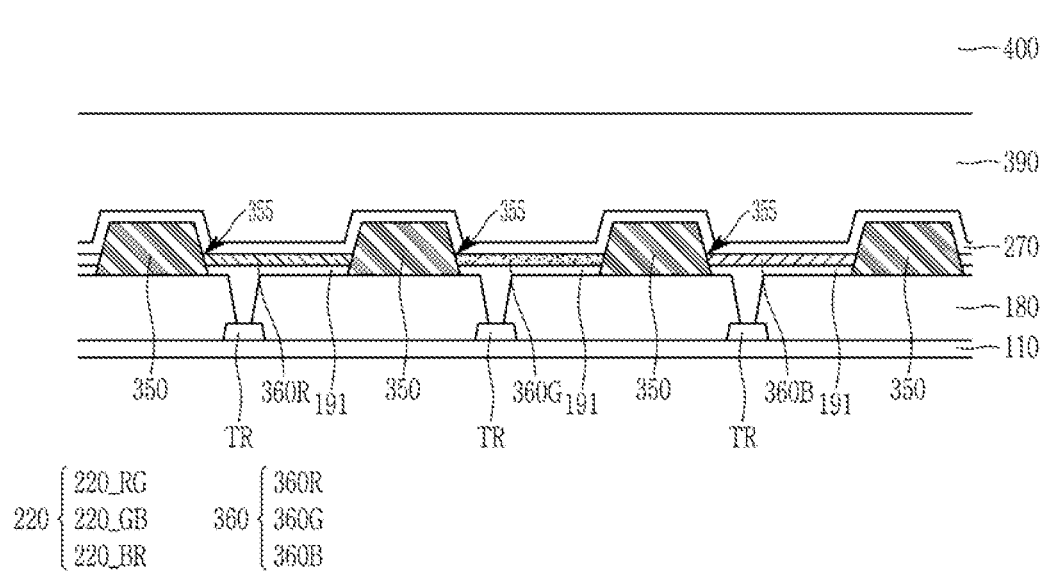
FIG. 5 shows a display device including a polarization layer.

FIG. 5 shows a display device including a polarization layer 400. In the case of the embodiment described with reference to FIG. 2, not the polarization layer but the partition wall 350 includes a light blocking material, and the color filter 230 is positioned to replace the function of the polarization layer. Referring to FIG. 5, the partition wall 350 does not include a light blocking material and includes a polarization layer 400 instead of the color filter 230.

Figure 6:
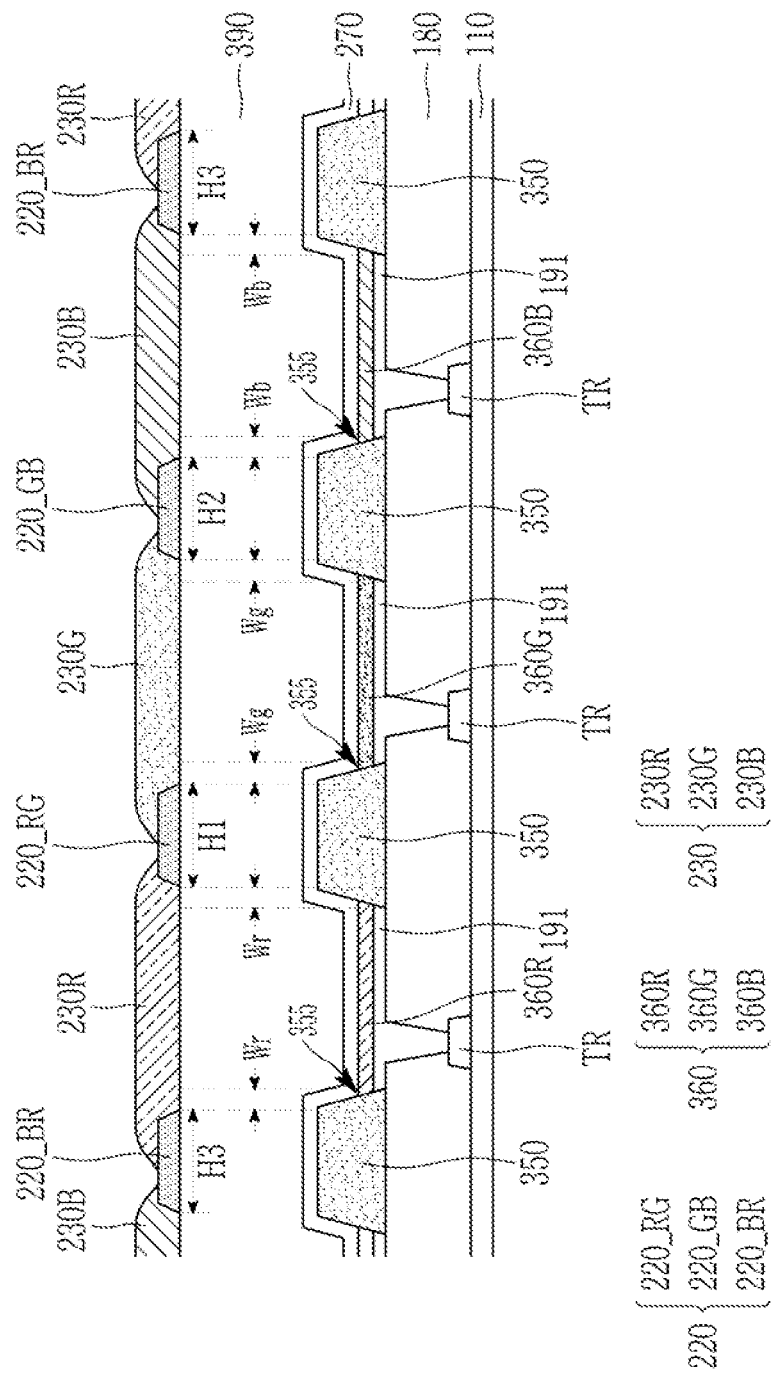
FIG. 6 shows a display device in which widths of a light blocking member are the same and distances between respective emission layers and a light blocking member are the same in a display device including no polarization layer as shown in FIG. 2.

FIG. 6 shows a display device including no polarization layer 400 in a like manner of what is shown in FIG. 2. However, differing from what is described with reference to FIG. 2, regarding the case of FIG. 6, the widths of the respective light blocking members are the same (H1=H2=H3), and simultaneously the distances between the respective emission layers and the light blocking member are the same (Wr=Wg=Wb)

Figure 7:
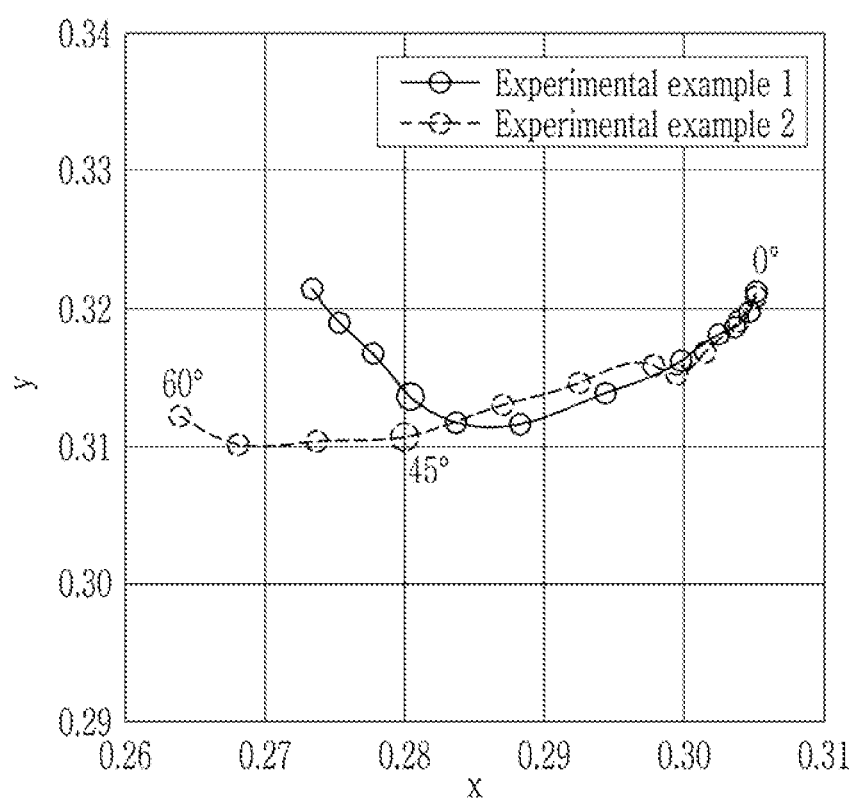
FIG. 7 shows color coordinates of Table 1.

Table 1 expresses movements of the color coordinates while visible angles are changed for the embodiment (Experimental Example 1) described with reference to FIG. 5 and the embodiment (Experimental Example 2) described with reference to FIG. 6. FIG. 7 shows color coordinates of Table 1.

TABLE 1

| Theta | Experimental Example 1 (POL) | | Experimental Example 2 (POL x) | |
|---|---|---|---|---|
| | x | y | x | y |
| T = 0° | 0.305 | 0.321 | 0.305 | 0.321 |
| T = 5° | 0.305 | 0.321 | 0.305 | 0.321 |
| T = 10° | 0.305 | 0.320 | 0.305 | 0.321 |
| T = 15° | 0.304 | 0.319 | 0.304 | 0.319 |
| T = 20° | 0.303 | 0.318 | 0.302 | 0.317 |
| T = 25° | 0.300 | 0.316 | 0.300 | 0.315 |
| T = 30° | 0.294 | 0.314 | 0.298 | 0.316 |
| T = 35° | 0.288 | 0.312 | 0.293 | 0.315 |
| T = 40° | 0.284 | 0.312 | 0.287 | 0.313 |
| T = 45° | 0.280 | 0.314 | 0.280 | 0.311 |
| T = 50° | 0.278 | 0.317 | 0.274 | 0.311 |
| T = 55° | 0.275 | 0.319 | 0.268 | 0.310 |
| T = 60° | 0.273 | 0.322 | 0.264 | 0.312 |

Referring to Table 1 and FIG. 7, in the case of the embodiment (=Experimental Example 1) described with reference to FIG. 5, the color coordinates move to the top left as the visible angle of the display device increases (the more seen from the lateral side). This indicates a region expressing green, and the image becomes greenish when seen from the lateral side in the display device according to an embodiment described with reference to FIG. 5.

Referring to FIG. 6 and FIG. 7, in the case of the embodiment (=Experimental Example 2) described with reference to FIG. 6, the color coordinates move to the left as the visible angle of the display device increases (as the display is viewed more from the lateral side). For example, the image becomes bluish when seen from the lateral side in the display device according to an embodiment described with reference to FIG. 6.

As described above, the color sense seen from the lateral side of the display device (Experimental Example 2) including no polarization layer is different from the color sense seen from the lateral side of the display device (Experimental Example 1) including a polarization layer. A user experiences the color sense seen from the lateral side of the display device (Experimental Example 1) including a polarization layer, and the user prefers the greenish color to the bluish color, so the color sense seen from the lateral side of the display device including no polarization layer may be made to be greenish in a similar way to the color sense seen from the lateral side of the display device including a polarization layer.

The display device, as shown in FIG. 1, satisfies "the width (H3) of the third light blocking member≥the width (H2) of the second light blocking member≥the width (H1) of the first light blocking member," satisfies "the distance (Wg) between the one edge of the partition wall 350 contacting the second emission layer (green) and the light blocking member≥the distance (Wr) between the one edge of the partition wall 350 contacting the first emission layer (red) and the light blocking member≥the distance (Wb) between the one edge of the partition wall 350 contacting the third emission layer (blue) and the light blocking member," or satisfies "the width (H3) of the third light blocking member≥the width (H2) of the second light blocking member≥the width (H1) of the first light blocking member" and simultaneously satisfies "the distance (Wg) between the one edge of the partition wall 350 contacting the second emission layer (green) and the light blocking member≥the distance (Wr) between the one edge of the partition wall 350 contacting the first emission layer (red) and the light blocking member≥the distance (Wb) between the one edge of the partition wall 350 of the third emission layer (blue) and the light blocking member" so that the color sense seen from the lateral side of the display device including no polarization layer may be similar to the color sense seen from the lateral side of the display device including a polarization layer.

Figure 8:
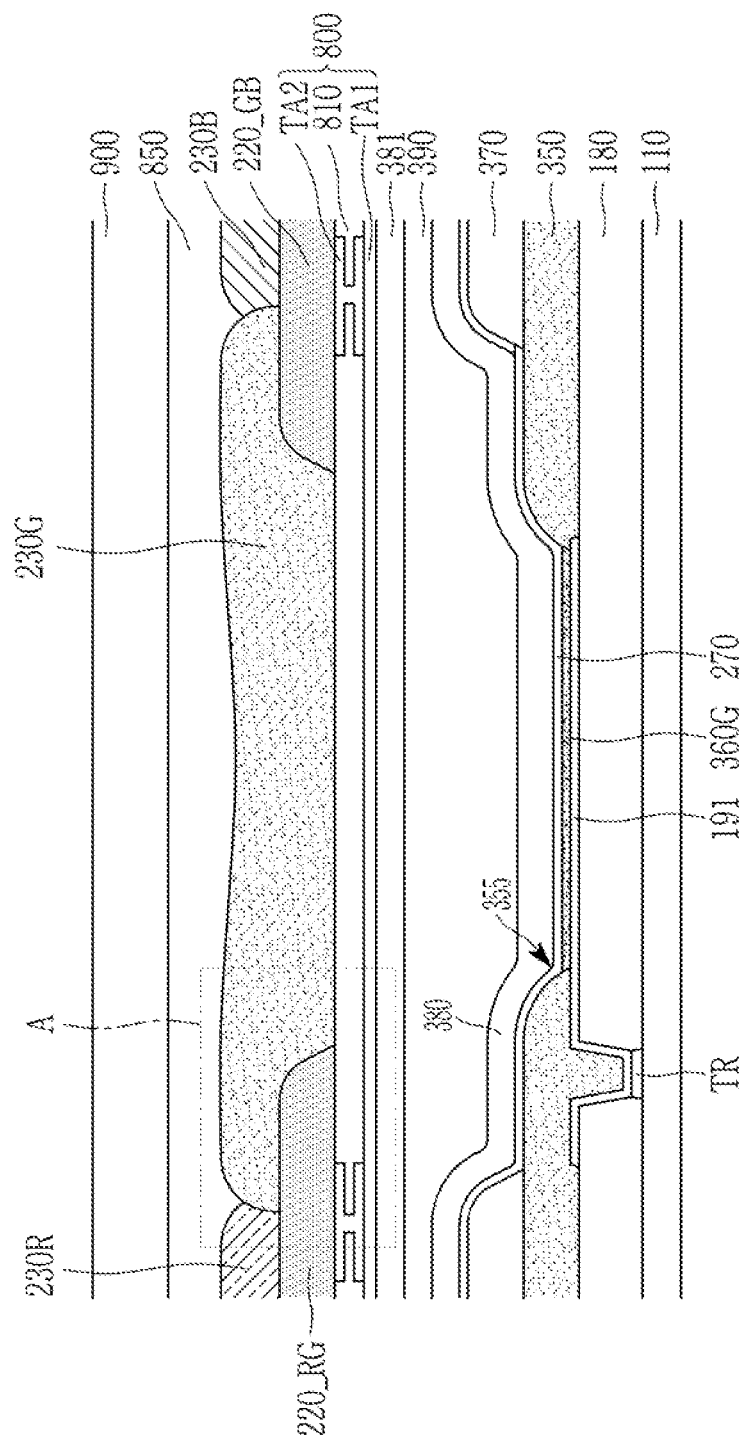
FIG. 8 shows a detailed cross-sectional view of a display device according to an embodiment of FIG. 2.

FIG. 8 shows a detailed cross-sectional view of a display device according to an embodiment of FIG. 2.

Referring to FIG. 8, the display device includes a substrate 110, and a transistor (TR) positioned on the substrate 110. Although briefly illustrated, the transistor (TR) may include a gate electrode, a semiconductor layer, a source electrode, and a drain electrode.

A first electrode 191 is connected to the transistor (TR). An insulating layer 180 is positioned between the first electrode 191 and the transistor (TR). A partition wall 350 is positioned on the insulating layer 180. The partition wall 350 may include a black material and may have a light blocking function. The partition wall 350 may have an opening 355 overlapping the first electrode 191. A second emission layer 360G is positioned in the opening 355. FIG. 8 mainly shows the second emission layer 360G of the display device shown in FIG. 2. A spacer 370 may be positioned in a predetermined region of the partition wall 350. The spacer 370 may include a same material as the partition wall 350 and may be integrally formed with the partition wall 350, or it may include a material that is different from the partition wall 350.

A second electrode 270 is positioned on the second emission layer 360G. The second electrode 270 may be positioned on the partition wall 350 and the spacer 370.

A capping layer 380 may be positioned on the second electrode 270. The capping layer 380 may be an inorganic film and may be formed by a CVD process. The capping layer 380 may be omitted depending on embodiments. An encapsulation layer 390 may be positioned on the capping layer 380. The encapsulation layer 390 may have a structure in which organic films and inorganic films are alternately formed. Alternatively, the encapsulation layer 390 may include an organic material.

An intermediate layer 381 may be positioned on the encapsulation layer 390. The intermediate layer 381 may be an inorganic film and may be formed by the CVD process. The intermediate layer 381 may be omitted depending on embodiments.

A touch sensing layer 800 is positioned on the intermediate layer 381. The touch sensing layer 800 may include sensing electrodes TA1 and TA2 and a touch insulating layer 810. The touch sensing layer 800 is integrally included in the display device according to the present embodiment. The touch sensing layer 800 may be omitted depending on embodiments.

A light blocking member 220 is positioned on the touch sensing layer 800. Descriptions on the light blocking member 220 correspond to what is described with reference to FIG. 2. To the extent that a detailed description of a particular element has been omitted, it may be assumed that the element is at least similar to corresponding elements that have been disclosed elsewhere within the instant specification. FIG. 8 shows a first light blocking member 220_RG and a second light blocking member 220_GB.

A second color filter 230G is positioned between the first light blocking member 220_RG and the second light blocking member 220_GB. A first color filter 230R may be positioned between the second color filter 230G and the first light blocking member 220_RG, and a third color filter 230B may be positioned between the second color filter 230G and the second light blocking member 220_GB. As described above, the first color filter 230R may be a red color filter, the second color filter 230G may be a green color filter, and the third color filter 230B may be a blue color filter.

Referring to FIG. 8, a planarization layer 850 is positioned on the color filter 230. The planarization layer 850 may planarize an upper side of the color filter 230. A window 900 may be positioned on the planarization layer 850.

Figure 9:
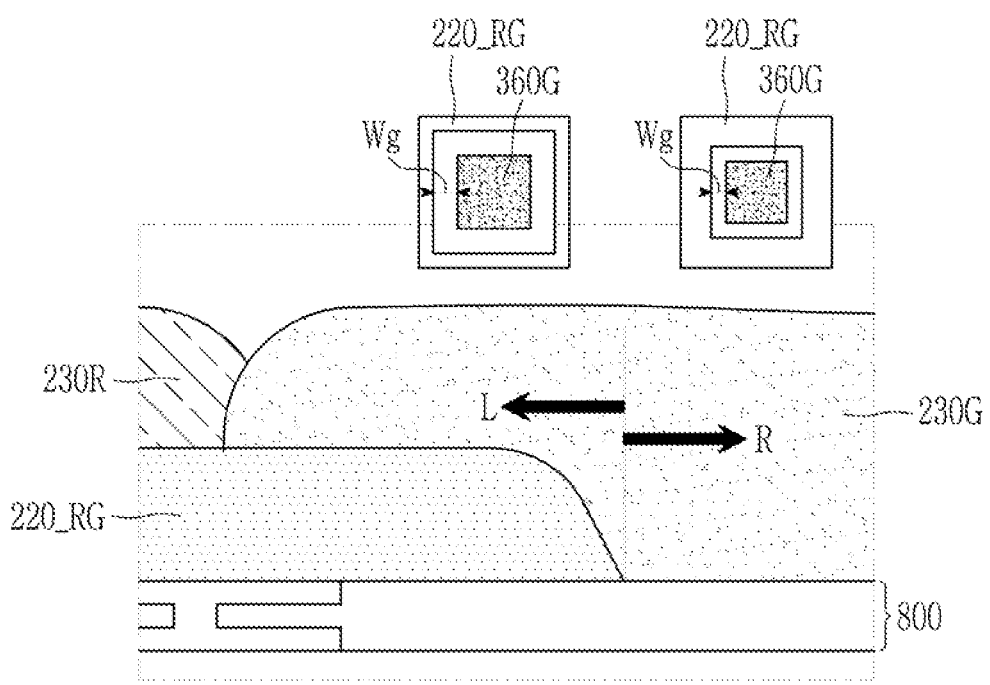
FIG. 9 shows an enlarged portion marked with A in FIG. 8.

FIG. 9 shows an enlarged portion marked with A in FIG. 8. A configuration for adjusting the distance between the emission layer 360 and the light blocking member 220 will now be described with reference to FIG. 9. For example, when the width of the first light blocking member 220_RG is reduced in a direction marked with an arrow of L, the distance (Wg) between the emission layer 360G and the first light blocking member 220_RG is increased. On the contrary, when the width of the first light blocking member 220_RG is increased in a direction marked with an arrow of R, the distance (Wg) between the emission layer 360G and the first light blocking member 220_RG is reduced.

When the portions drawn above the arrow of L and the arrow of R shown in FIG. 9 are compared, it is found that Wg increases when the first light blocking member 220_RG moves in the direction of the arrow of L, and Wg decreases when the first light blocking member 220_RG moves in the direction of the arrow of R.

Figure 10:
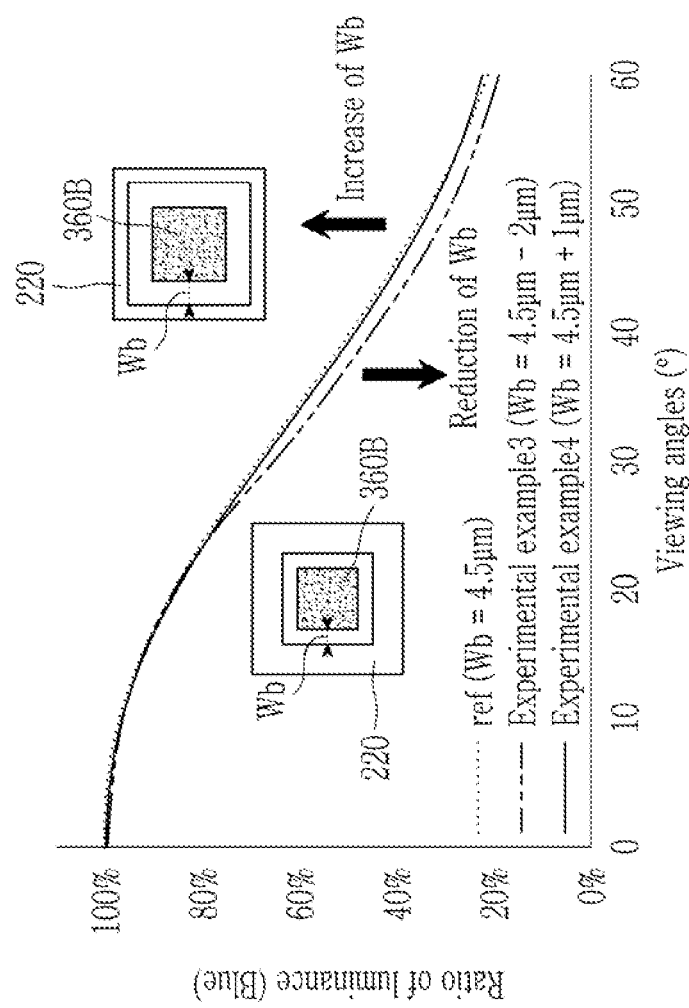
FIG. 10 shows luminance with respect to viewing angles measured while varying a distance between a blue emission layer and a light blocking member.

FIG. 10 shows luminance with respect to viewing angles measured while varying a distance (Wb) between a blue emission layer 360B and a light blocking member 220. Referring to FIG. 10, it is found that a ratio of luminance is reduced when the distance (Wb) between the blue emission layer 360B and the light blocking member 220 is reduced by 2 μm further than the reference value (4.5 μm) (Experimental Example 3). It is also found that, when the distance between the blue emission layer 360B and the light blocking member 220 is increased by 1 μm further than the reference value (4.5 μm) (Experimental Example 4), it has the same ratio of luminance as the reference value (Ref) and the ratio of luminance is not increased or reduced any longer.

When the drawing shown in FIG. 10 is compared, it is found that Wb is reduced when the width of the light blocking member 220 increases (shown below the curves in the drawing), and Wb is increased when the width of the light blocking member 220 is reduced (shown above the curves in the drawing).

The luminance with respect to the viewing angle is measured while increasing (+1 μm) and reducing (−1 μm and −2 μm) the distance between the emission layer and the light blocking member from Ref (4.5 μm) for the red emission layer 360R, the green emission layer 360G, and the blue emission layer 360B according to the same method as what is described with reference to FIG. 10. Results are expressed in Table 2.

TABLE 2

| Viewing angle (°) | Red | | | | Green | | | | Blue | | | |
| --- | --- | --- | --- | --- | --- | --- | --- | --- | --- | --- | --- | --- |
| | +1 μm 122% | Ref 100% | −1 μm 77% | −2 μm 55% | +1 μm 122% | Ref 100% | −1 μm 77% | −2 μm 55% | +1 μm 122% | Ref 100% | −1 μm 77% | −2 μm 55% |
| 0 | 100% | 100% | 100% | 100% | 100% | 100% | 100% | 100% | 100% | 100% | 100% | 100% |
| 5 | 100% | 100% | 100% | 100% | 100% | 100% | 100% | 100% | 100% | 100% | 100% | 100% |
| 10 | 100% | 100% | 100% | 100% | 100% | 100% | 100% | 100% | 100% | 100% | 100% | 100% |
| 15 | 100% | 100% | 100% | 100% | 100% | 100% | 100% | 100% | 100% | 100% | 100% | 100% |
| 20 | 100% | 100% | 100% | 100% | 100% | 100% | 100% | 100% | 100% | 100% | 100% | 100% |
| 25 | 100% | 100% | 100% | 98% | 100% | 100% | 100% | 9% | 100% | 100% | 100% | 98% |
| 30 | 100% | 100% | 100% | 96% | 100% | 100% | 100% | 96% | 100% | 100% | 100% | 96% |
| 35 | 100% | 100% | 100% | 94% | 100% | 100% | 100% | 94% | 100% | 100% | 100% | 94% |
| 40 | 100% | 100% | 98% | 92% | 100% | 100% | 98% | 92% | 100% | 100% | 98% | 93% |
| 45 | 100% | 100% | 96% | 90% | 100% | 100% | 96% | 90% | 100% | 100% | 96% | 91% |
| 50 | 100% | 99% | 94% | 88% | 100% | 99% | 94% | 88% | 100% | 99% | 94% | 89% |
| 55 | 100% | 97% | 92% | 87% | 100% | 97% | 92% | 86% | 100% | 98% | 92% | 87% |
| 60 | 100% | 96% | 90% | 85% | 100% | 96% | 90% | 84% | 100% | 96% | 91% | 86% |

Referring to Table 2, it is found that the luminance increases with respect to Ref when the distances between the respective emission layers 360R, 360G, and 360B and the light blocking member are increased, and the luminance reduces with respect to Ref when the distances between the respective emission layers 360R, 360G, and 360B and the light blocking member are reduced.

Figure 11:
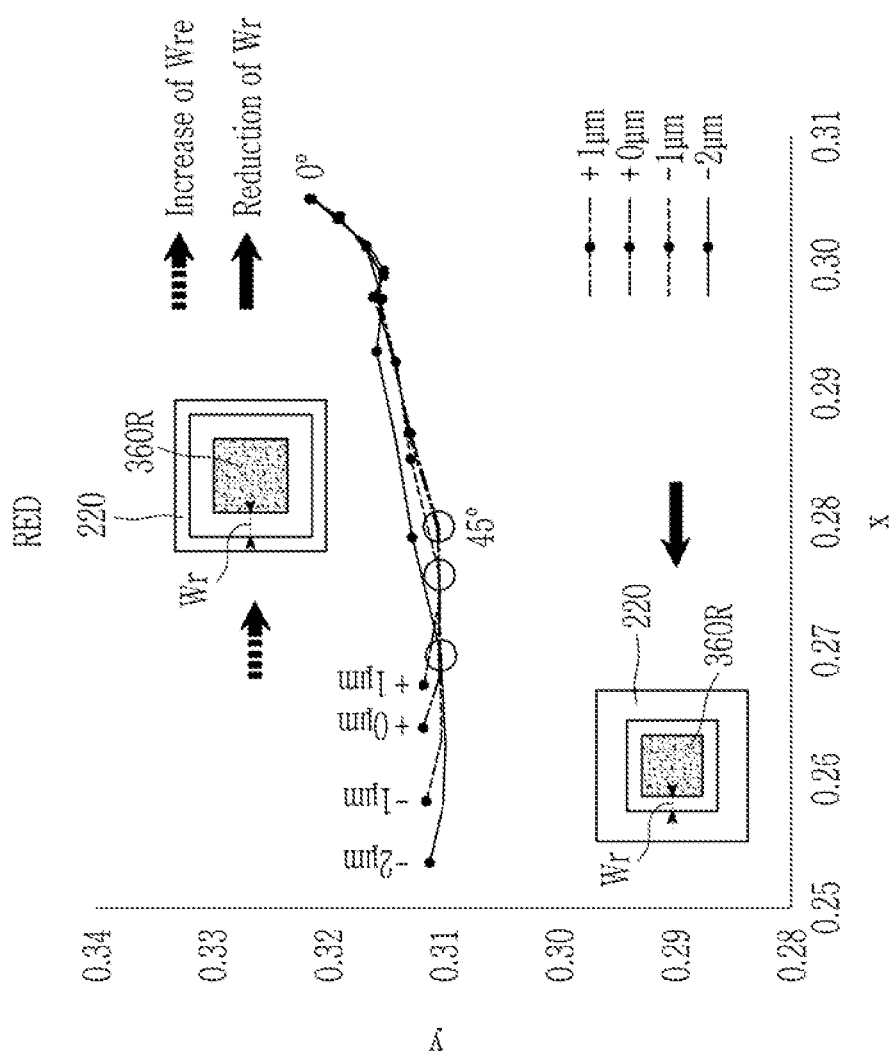
FIG. 11 to FIG. 13 show movement of color coordinates with respect to viewing angles while increasing or reducing a distance between an emission layer and a light blocking member for respective emission layers, and in detail.
Figure 12:
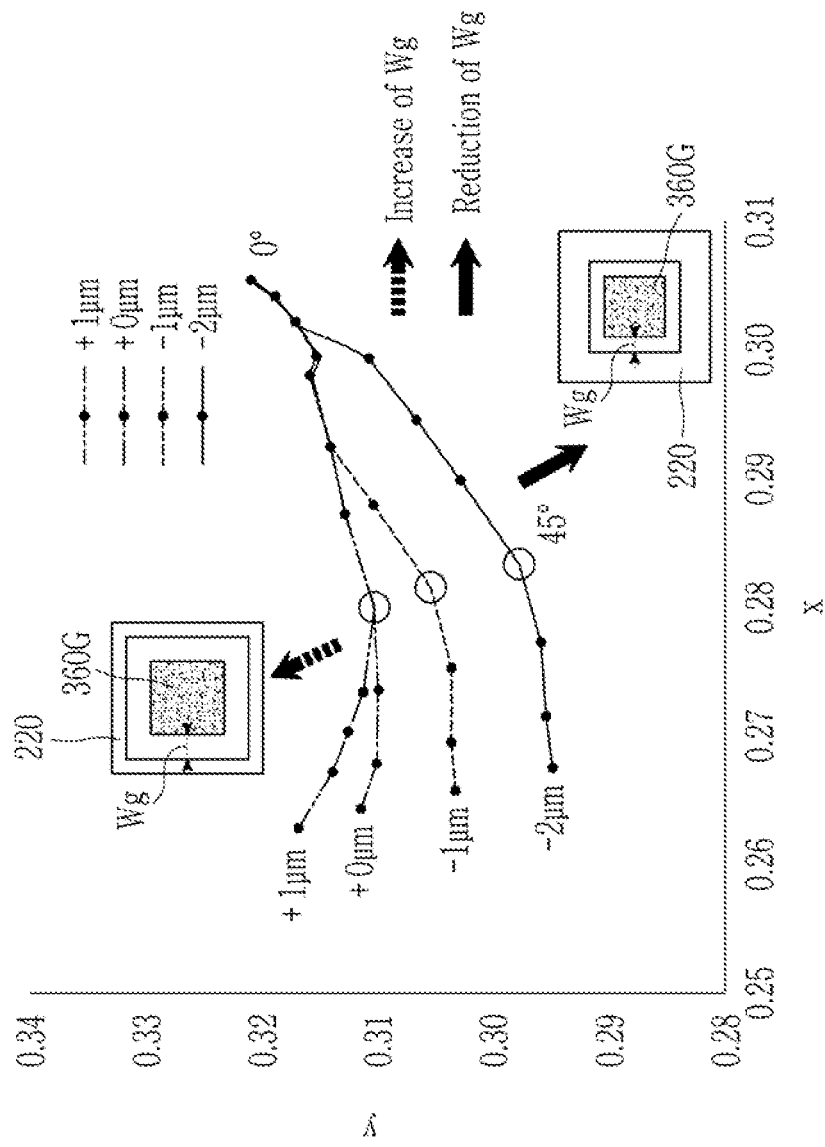
Figure 13:
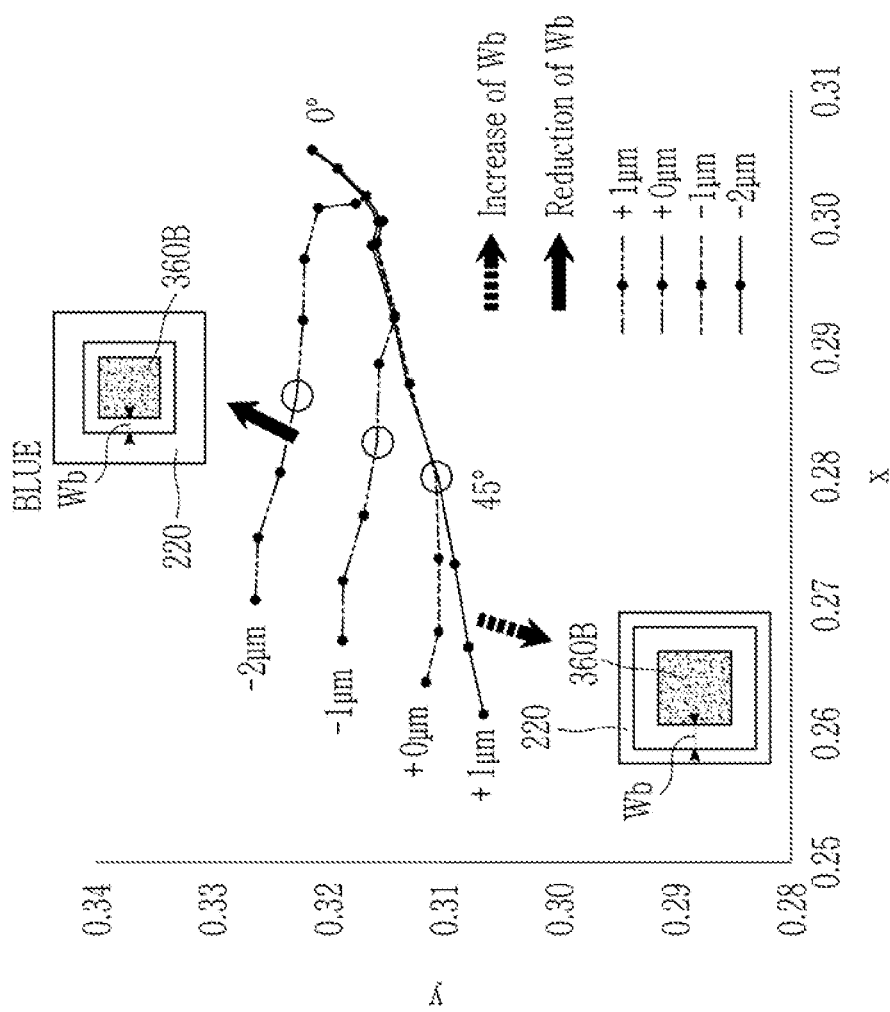

The movement of the color coordinates with respect to the viewing angle by increasing or reducing the distance between the emission layer and the light blocking member for the respective emission layers is shown in FIG. 11 to FIG. 13.

FIG. 11 shows results on a red emission layer 360R, FIG. 12 shows results on a green emission layer 360G, and FIG. 13 shows results on a blue emission layer 360B.

FIG. 11 shows results on the red emission layer 360R. Referring to FIG. 11, it is found that the movement of the color coordinates of the red emission layer with respect to the viewing angle is not big when the distance (Wr) between the emission layer and the light blocking member is increased or reduced.

FIG. 12 shows results on the green emission layer 360G. Referring to FIG. 12, it is found that the color coordinates of the green emission layer with respect to the viewing angle moves to the top left when the distance between the emission layer and the light blocking member is increased (+1 μm). For example, it is found that the color sense seen from the lateral side becomes greenish when the distance between the green emission layer and the light blocking member is increased. It is also found that the color coordinates of the green emission layer with respect to the viewing angle moves to the bottom right when the distance between the emission layer and the light blocking member is reduced (−1 μm and −2 μm).

FIG. 13 shows results on the blue emission layer 360B. Referring to FIG. 13, it is found that the color coordinates of the blue emission layer with respect to the viewing angle moves to the bottom left when the distance between the emission layer and the light blocking member is increased (+1 μm). It is also found that the color coordinates of the blue emission layer with respect to the viewing angle moves to the top right when the distance between the emission layer and the light blocking member is reduced (−1 μm and −2 μm). Therefore, it is found that the color sense seen from the lateral side of the blue emission layer becomes greenish when the distance between the emission layer and the light blocking member is reduced (−1 μm and −2 μm).

Figure 14:
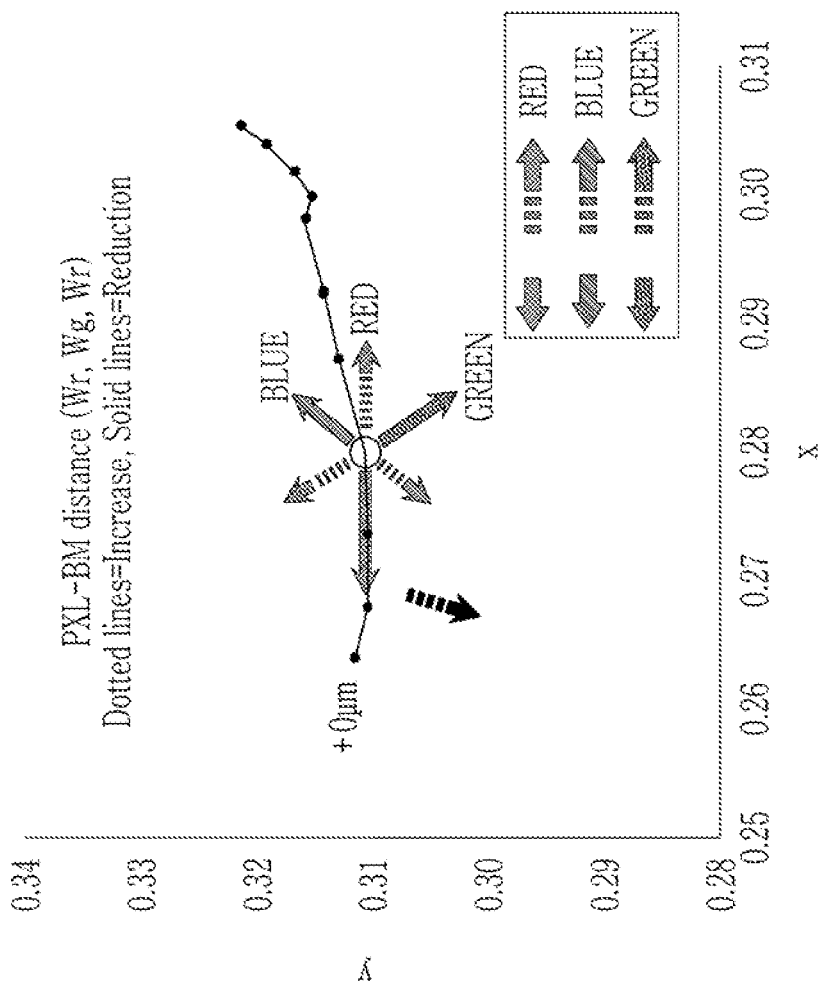
FIG. 14 shows a summary of results obtained from FIG. 11 to FIG. 13.

FIG. 14 shows a summary of results obtained from FIG. 11 to FIG. 13. Referring to FIG. 14, the movement of the color coordinates when the distance between the emission layer and the light blocking member is increased is shown with dotted lines, and the movement of the color coordinates when the distance between the emission layer and the light blocking member is reduced is shown with solid lines.

Referring to FIG. 14, in the case of the red emission layer, it is found that the color coordinates move to the right when the distance with the light blocking member increases, and the color coordinates move to the left when the distance is reduced. The movement in the upward or downward direction is not noticeable.

In the case of the green emission layer, it is found that the color coordinates move to the top left when the distance with the light blocking member increases, and the color coordinates move to the bottom right when the distance reduces. Therefore, it is found that the distance between the green emission layer and the light blocking member is to be increased so as to express the greenish color when seen from the lateral side.

In the case of the blue emission layer, it is found that the color coordinates move to the bottom left when the distance with the light blocking member increases, and the color coordinates move to the top right when the distance with the light blocking member reduces. Hence, it is found that the distance between the blue emission layer and the light blocking member is to be reduced so as to express the greenish color when seen from the lateral side.

As shown in FIG. 2, the display device increases the distance (Wg) between the green emission layer (second emission layer, 360G) and the light blocking member, and reduces the distance (Wb) between the blue emission layer (third emission layer, 360B) and the light blocking member.

Figure 15:
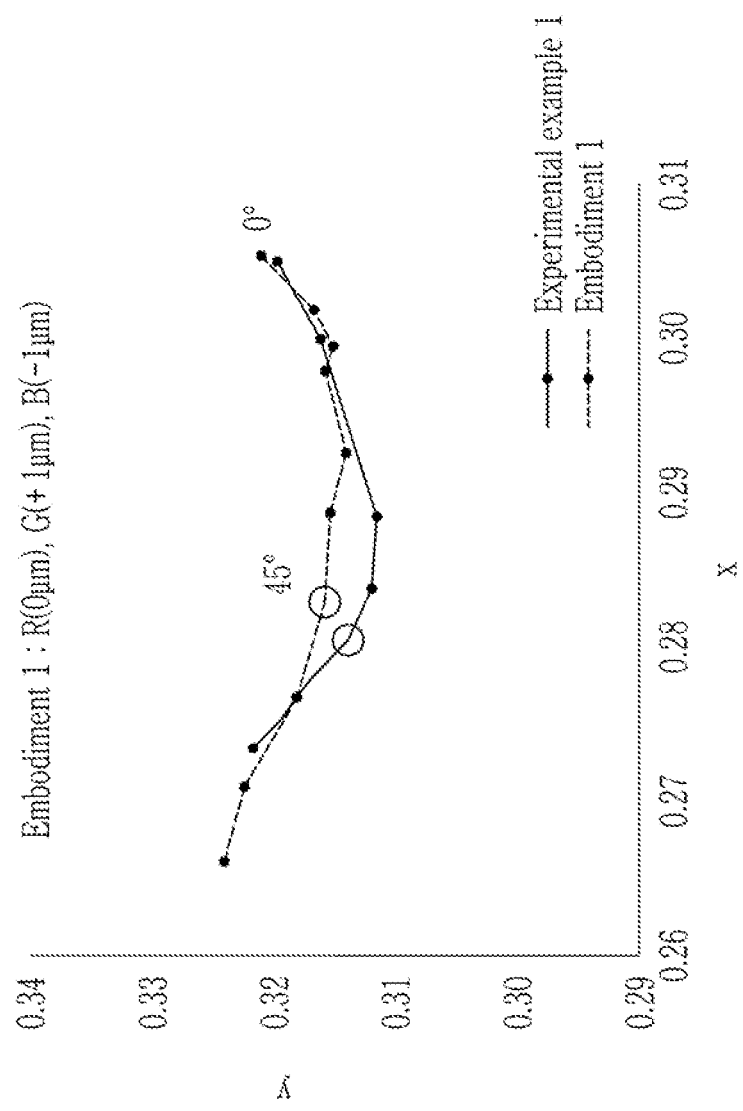
FIG. 15 shows color coordinates with respect to viewing angles, regarding a display device in which a distance (Wr) between a red emission layer and a light blocking member is set to be a reference, a distance (Wg) between a green emission layer and a light blocking member is increased by 1 μm compared to the reference, and a distance (Wb) between a blue emission layer and a light blocking member is decreased by 1 μm compared to the reference.

FIG. 15 shows color coordinates with respect to viewing angles, regarding a display device in which a distance (Wr) between a red emission layer (first emission layer, 360R) and a light blocking member is set to be a reference (=4.5 μm), the distance (Wg) between the green emission layer (second emission layer, 360G) and the light blocking member is increased by 1 μm compared to the reference, and the distance (Wb) between the blue emission layer (third emission layer, 360B) and the light blocking member is decreased by 1 μm compared to the reference. Referring to FIG. 15, it is found that the color coordinates of the display device (Experimental Example 1) including a polarization layer are substantially similar to the color coordinates of the display device (embodiment 1) in which the distance (Wg)

between the green emission layer (second emission layer, 360G) and the light blocking member are increased by 1 μm further compared to the reference according to the present embodiment, and the distance (Wb) between the blue emission layer (third emission layer, 360B) and the light blocking member is reduced by 1 μm. Particularly, as the viewing angle becomes higher, trajectories of the color coordinates become similar to each other, so it is found that they have similar color senses when seen from the lateral side.

When the changes of Wr, Wg, and Wh of FIG. 15 are changed according to a relative ratio, and Wr is set to be 100%, Wg corresponds to about 122%, and Wb corresponds to about 77%. Therefore, it is found that they have similar color senses when seen from the lateral side when Wg and Wb are in the range of 25% with reference to Wr. For example, when a length of Wr is not 4.5 μm and has other values, and Wg and Wb are changed with the value of ±25% with reference to Wr, it may have a similar effect to the case of FIG. 15.

Figure 16:
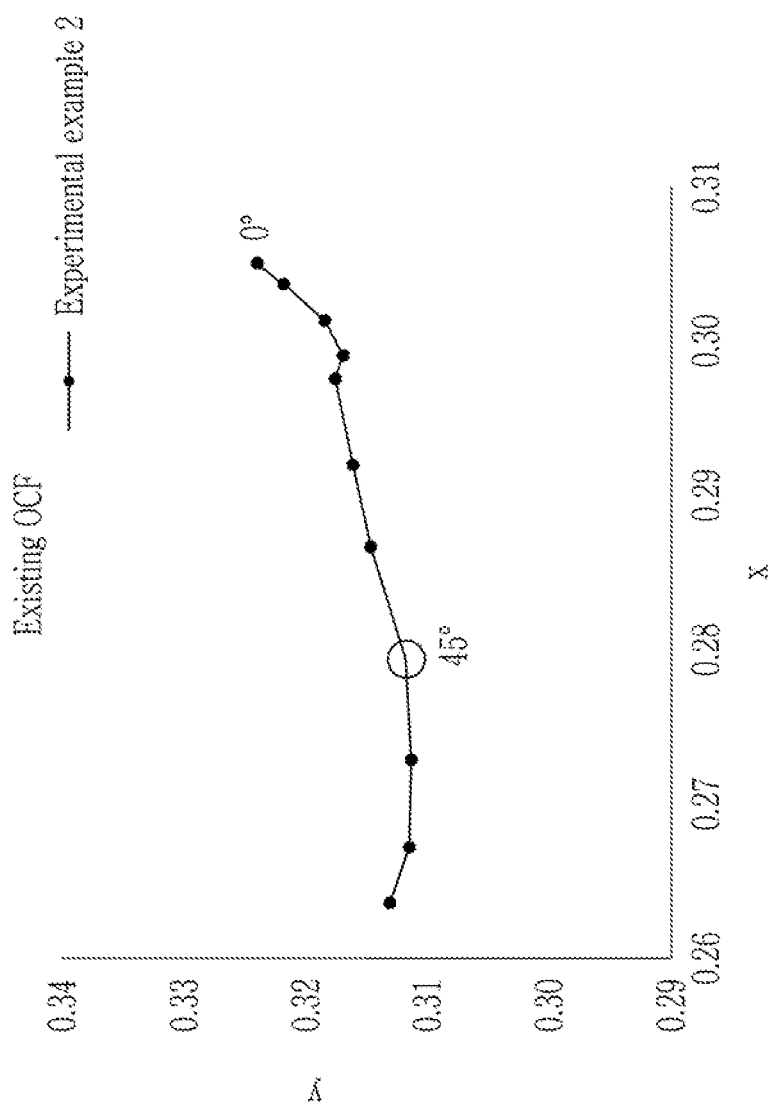
FIG. 16 shows results of measuring color coordinates with respect to viewing angles, regarding an embodiment described with reference to FIG. 6 in which distances between an emission layer and a light blocking member are the same for respective pixels.

FIG. 16 shows results (Experimental Example 2) of measuring color coordinates with respect to viewing angles, and regarding an embodiment described with reference to FIG. 6 in which distances between an emission layer and a light blocking member are the same for respective pixels. When FIG. 6 and the Embodiment 1 of FIG. 15 are compared, it is found that the color coordinates with respect to the viewing angle move to the top right according to an adjustment of the distance between the emission layer and the light blocking member. Therefore, it is found that Embodiment 1 has the greenish color when seen from the lateral side, compared to Experimental Example 2.

An embodiment of the present invention will now be described. Referring to FIG. 2, the distances between the light blocking member and the respective green emission layer and the blue emission layer are increased or reduced compared to the reference value (=Wr, the distance between the red emission layer and the light blocking member), and the similar effect may be obtained when one of the two is changed.

Figure 17:
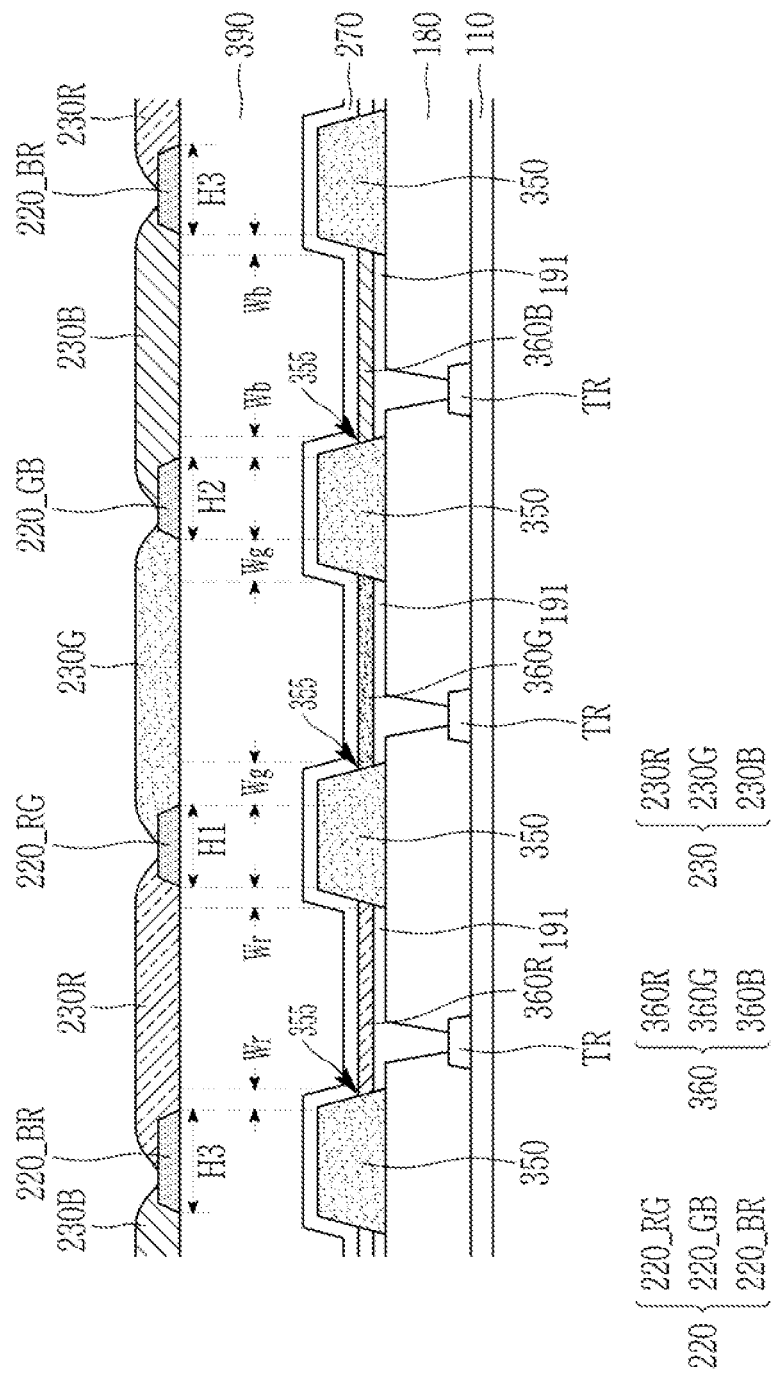
FIG. 17 shows a same region as that shown in FIG. 2 in a display device according to an embodiment of the present disclosure.

FIG. 17 shows a same region as that shown in FIG. 2 in a display device according to an embodiment of the present disclosure. Referring to FIG. 17, the distance (Wg) between the second emission layer 360G and the light blocking members 220_RG and 220_GB is greater than the distance (Wr) between the first emission layer 360R and the light blocking members 220_BR and 220_RG. Referring to FIG. 17 in comparison to FIG. 2, the distance (Wb) between the third emission layer 360B and the light blocking members 220_GB and 220_BR is not changed but remains the same with respect to the reference value (Wr). For example, the relationship of Wr=Wb<Wg is satisfied.

For example, the distance (Wg) between the green emission layer and the light blocking member is changed, and the distance (Wb) between the blue emission layer and the light blocking member is not changed in comparison to the reference value (Wg), and other remaining parts correspond to the embodiment described with reference to FIG. 2. To the extent that a detailed description of a particular element has been omitted, it may be assumed that the element is at least similar to corresponding elements that have been disclosed elsewhere within the instant specification. As shown in FIG. 14, the color coordinates move to the top left because of the increase of the distance between the green emission layer and the light blocking member, so the same effects may be obtained in the case of what is described with reference to FIG. 17. For example, when seen from the lateral side, it may have the greenish color in a like manner of the display device including a polarization layer.

Figure 18:
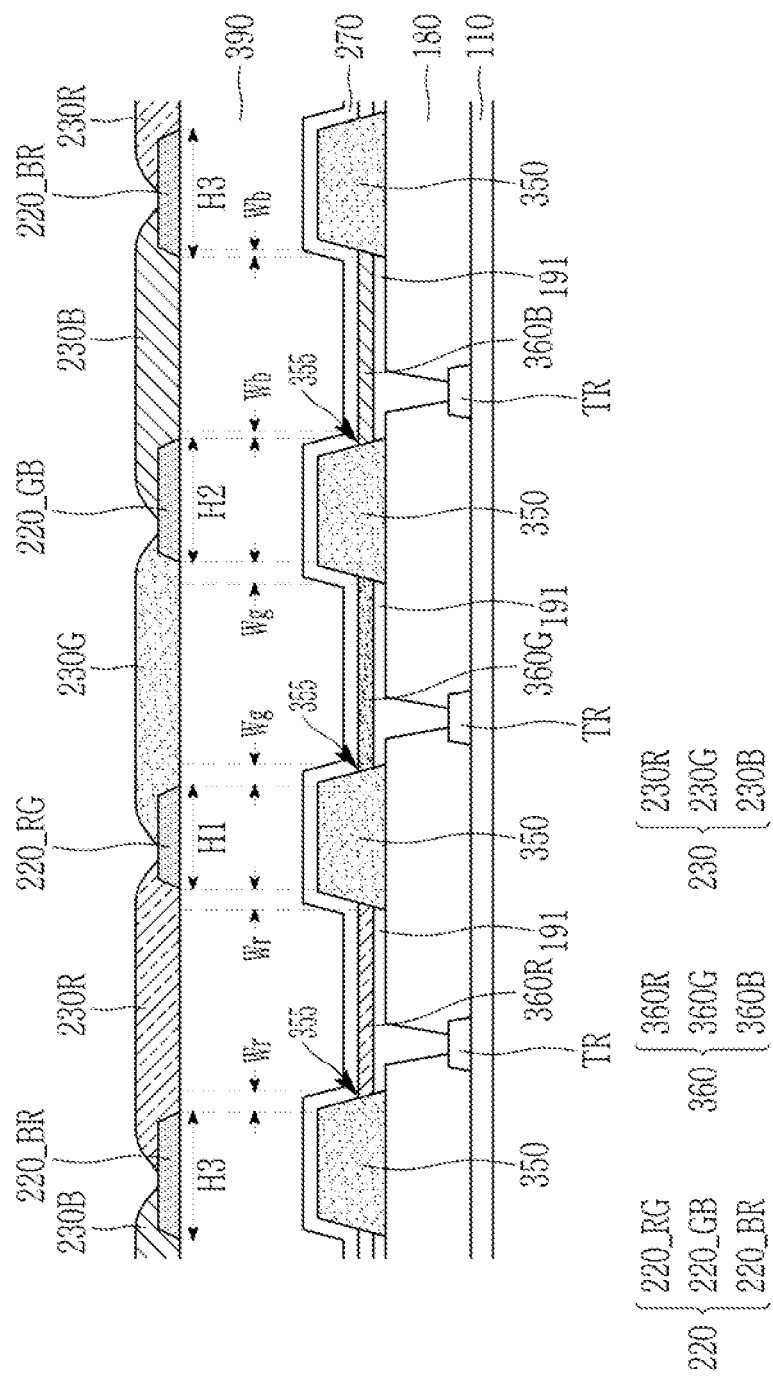
FIG. 18 shows a same region as that shown in FIG. 2 in a display device according to an embodiment of the present disclosure.

FIG. 18 shows a same region as that shown in FIG. 2 in a display device according to an embodiment. Referring to FIG. 18, the distance (Wb) between the third emission layer 360B and the light blocking members 220_GB and 220_BR is less than the distance (Wr) between the first emission layer 360R and the light blocking members 220_BR and 220_RG. Referring to FIG. 18 in comparison to FIG. 2, the distance (Wg) between the second emission layer 360G and the light blocking members 220_RG and 220_GB is not changed but remains the same with respect to the reference value (Wr). For example, the relationship of Wb<Wr=Wg is satisfied.

For example, the distance between the blue emission layer and the light blocking member is changed, and the distance between the green emission layer and the light blocking member is not changed in comparison to the reference value, and other remaining parts correspond to the embodiment described with reference to FIG. 1. To the extent that a detailed description of a particular element has been omitted, it may be assumed that the element is at least similar to corresponding elements that have been disclosed elsewhere within the instant specification. As shown in FIG. 14, the color coordinates move upward because of the reduction of the distance between the blue emission layer and the light blocking member, so the same effects may be obtained in the case of what is described with reference to FIG. 18. For example, when seen from the lateral side, it may have the greenish color in a like manner of the display device including a polarization layer.

While this invention has been described in connection with what is presently considered to be practical example embodiments, it is to be understood that the invention is not necessarily limited to the disclosed embodiments, but, on the contrary, is intended to cover various modifications and equivalent arrangements included within the spirit and scope of the present disclosure.

What is claimed is:

1. A display device, comprising:
    a substrate;
    a partition wall disposed on the substrate and having a plurality of openings disposed therein;
    a first emission layer, a second emission layer, and a third emission layer each disposed in an opening of the plurality of openings of the partition wall and emitting lights of different colors from each other;
    a light blocker disposed on the first, second, and third emission layers and including a plurality of openings respectively overlapping the first emission layer, the second emission layer, and the third emission layer; and
    a color filter disposed in the plurality of opening of the light blocker,
    wherein a separation distance between one edge of the partition wall contacting the second emission layer and the light blocker is greater than a separation distance between one edge of the partition wall contacting the first emission layer and the light blocker.

2. The display device of claim 1, wherein
    a separation distance between the one edge of the partition wall contacting the first emission layer and the light blocker is greater than a separation distance between one edge of the partition wall contacting the third emission layer and the light blocker.

3. The display device of claim 2, wherein
    the first emission layer emits red light,
    the second emission layer emits green light, and
    the third emission layer emits blue light.

4. The display device of claim 3, wherein
a separation distance between the one edge of the partition wall contacting the second emission layer and the light blocker is greater than a separation distance between the one edge of the partition wall contacting the first emission layer and the light blocker by 1 μm, and
a separation distance between the one edge of the partition wall contacting the first emission layer and the light blocker is greater than a separation distance between the one edge of the partition wall contacting the third emission layer and the light blocker by 1 μm.

5. The display device of claim 2, wherein
a difference between a separation distance between one edge of a partition wall contacting the first emission layer and the light blocker and a separation distance between one edge of a partition wall contacting the third emission layer and the light blocker is equal to or less than 5 μm.

6. The display device of claim 1, wherein
a separation distance between the one edge of the partition wall contacting the first emission layer and the light blocker is within a range of 3.5 μm to 5.5 μm.

7. The display device of claim 1, wherein
a difference between a separation distance of the one edge of the partition wall contacting the second emission layer and the light blocker and a separation distance between the one edge of the partition wall contacting the first emission layer and the light blocker is equal to or less than 5 μm.

8. The display device of claim 1, wherein
a separation distance between the one edge of the partition wall contacting the second emission layer and the light blocker and a separation distance between the one edge of the partition wall contacting the first emission layer and the light blocker are within 25% of each other.

9. The display device of claim 1, wherein
a separation distance between the one edge of the partition wall contacting the first emission layer and the light blocker and a separation distance between one edge of the partition wall contacting the third emission layer and the light blocker are within 25% of each other.

10. The display device of claim 1, wherein
the color filter includes:
a first color filter overlapping the first emission layer in a direction that is perpendicular to a side of the substrate;
a second color filter overlapping the second emission layer in the direction that is perpendicular to the side of the substrate; and
a third color filter overlapping the third emission layer in the direction that is perpendicular to the side of the substrate,
wherein the first color filter, the second color filter, and the third color filter have different colors from each other.

11. The display device of claim 10, wherein
a width of the light blocker disposed between the first color filter and the second color filter is less than a width of the light blocker disposed between the second color filter and the third color filter.

12. The display device of claim 11, wherein
a width of the light blocker disposed between the second color filter and the third color filter is less than a width of the light blocker disposed between the third color filter and the first color filter.

13. The display device of claim 12, wherein
the first color filter is a red color filter,
the second color filter is a green color filter, and
the third color filter is a blue color filter.

14. The display device of claim 10, wherein
a width of the light blocker disposed between the first color filter and the second color filter, a width of the light blocker disposed between the second color filter and the third color filter, and a width of the light blocker disposed between the third color filter and the first color filter are all the same as one another.

15. The display device of claim 1, further comprising:
a plurality of transistors disposed on the substrate;
a plurality of first electrodes respectively connected to the plurality transistors; and
a second electrode disposed on the first emission layer, the second emission layer, the third emission layer, and the partition wall.

16. The display device of claim 1, wherein
the partition wall includes a black material.

17. The display device of claim 1, wherein
the display device does not include a polarization layer.

18. A display device, comprising:
a substrate;
a partition wall disposed the substrate and having a plurality of openings;
a first emission layer, a second emission layer, and a third emission layer respectively disposed in the plurality of openings of the partition wall and emitting different colors of light from each other;
a light blocker disposed on the first, second, and third emission layers and having a plurality of openings respectively overlapping the first emission layer, the second emission layer, and the third emission layer; and
a color filter disposed in the plurality of opening of the light blocker,
wherein the color filter includes
a first color filter overlapping the first emission layer in a direction that is perpendicular to a side of the substrate,
a second color filter overlapping the second emission layer in the direction that is perpendicular to the side of the substrate,
a third color filter overlapping the third emission layer in the direction that is perpendicular to the side of the substrate, and
a width in a horizontal direction of the light blocker disposed between the second color filter and the third color filter is less than a width in the horizontal direction of the light blocker disposed between the third color filter and the first color filter.

19. The display device of claim 18, wherein
a width in the horizontal direction of the light blocker disposed between the first color filter and the second color filter is less than a width in the horizontal direction of the light blocker disposed between the second color filter and the third color filter.

20. The display device of claim 18, wherein
a separation distance in a vertical direction between one edge of the partition wall contacting the first emission layer and the light blocker,
a separation distance in the vertical direction between one edge of the partition wall contacting the second emission layer and the light blocker, and
a separation distance in the vertical direction between one edge of the partition wall contacting the third emission layer and the light blocker are the same as one another.

21. A display device, comprising:
a substrate;
a partition wall disposed on the substrate and having a plurality of openings;

a red emission layer, a green emission layer, and a blue emission layer respectively disposed in the plurality of openings of the partition wall; and a light blocker disposed on the red, green, and blue emission layers and having a plurality of openings respectively overlapping a red emission layer, a green emission layer, and a blue emission layer, wherein a separation distance between one edge of the partition wall contacting the red emission layer and the light blocker is greater than a separation distance between one edge of the partition wall contacting the blue emission layer and the light blocker.

22. The display device of claim 21, further comprising a color filter disposed in the opening of the light blocker, wherein the color filter includes a red color filter overlapping the red emission layer in a direction that is perpendicular to a side of the substrate, a green color filter overlapping the green emission layer in the direction that is perpendicular to the side of the substrate, and a blue color filter overlapping the blue emission layer in the direction that is perpendicular to the side of the substrate, wherein a width of the light blocker disposed between the green color filter and the blue color filter is greater than a width of the light blocker disposed between the red color filter and the green color filter.

23. The display device of claim 21, wherein the partition wall includes a black material, and the display device does not include a polarization layer.

24. The display device of claim 21, wherein a separation distance between the one edge of the partition wall contacting the red emission layer and the light blocker corresponds to a distance between one edge of the partition wall contacting the green emission layer and the light blocker.

25. The display device of claim 21, wherein a separation distance between one edge of the partition wall contacting the green emission layer and the light blocker is greater than a separation distance between the one edge of the partition wall contacting the red emission layer and the light blocker.

26. The display device of claim 21, further comprising:

a plurality of transistors disposed on the substrate;

a plurality of first electrodes respectively connected to the plurality of transistors;

a second electrode disposed on the red emission layer, the green emission layer, the blue emission layer, and the partition wall; and an encapsulation layer disposed on the second electrode.

* * * * *